(12) United States Patent
Park

(10) Patent No.: US 9,153,577 B2
(45) Date of Patent: Oct. 6, 2015

(54) NONVOLATILE MEMORY DEVICE AND METHOD OF FABRICATING THE SAME

(75) Inventor: Chan-Jin Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 351 days.

(21) Appl. No.: 13/537,454

(22) Filed: Jun. 29, 2012

(65) Prior Publication Data

US 2013/0034945 A1 Feb. 7, 2013

(30) Foreign Application Priority Data

Aug. 3, 2011 (KR) ........................ 10-2011-0077439

(51) Int. Cl.
*H01L 21/8239* (2006.01)
*H01L 27/06* (2006.01)
*H01L 27/10* (2006.01)
*H01L 27/24* (2006.01)
*H01L 45/00* (2006.01)

(52) U.S. Cl.
CPC .......... *H01L 27/0688* (2013.01); *H01L 27/101* (2013.01); *H01L 27/249* (2013.01); *H01L 27/2454* (2013.01); *H01L 45/04* (2013.01); *H01L 45/1226* (2013.01); *H01L 45/146* (2013.01)

(58) Field of Classification Search
CPC . H01L 27/0688; H01L 27/101; H01L 27/249; H01L 27/2454; H01L 45/04; H01L 45/146; H01L 45/1226; H01L 45/144; H01L 45/147
USPC ................... 438/381, 382, 238; 257/E21.645
See application file for complete search history.

(56) References Cited

U.S. PATENT DOCUMENTS

| 8,873,294 | B2 * | 10/2014 | Shim et al. ............... 365/185.18 |
| 2008/0023765 | A1 * | 1/2008 | Jeon et al. ...................... 257/350 |
| 2008/0149913 | A1 * | 6/2008 | Tanaka et al. ..................... 257/5 |
| 2009/0176340 | A1 * | 7/2009 | Kim ............................. 438/268 |
| 2009/0310425 | A1 * | 12/2009 | Sim et al. ................. 365/185.29 |
| 2010/0155687 | A1 * | 6/2010 | Reyes et al. ....................... 257/4 |
| 2010/0219392 | A1 * | 9/2010 | Awaya et al. ..................... 257/3 |
| 2011/0024818 | A1 * | 2/2011 | Ahn .............................. 257/314 |

(Continued)

FOREIGN PATENT DOCUMENTS

| JP | 2009-135324 | 6/2009 |
| JP | 2010-287872 | 12/2010 |
| KR | 1020110020533 A | 3/2011 |

*Primary Examiner* — Latanya N Crawford
(74) *Attorney, Agent, or Firm* — Myers Bigel Sibley & Sajovec, PA

(57) ABSTRACT

Provided is a method of fabricating a nonvolatile memory device. The method of fabricating a nonvolatile memory device, the method comprising: sequentially stacking a first interlayer insulating film, a first sacrificial film, a second interlayer insulating film, and a second sacrificial film on a semiconductor substrate; forming a first penetrating portion, which exposes a region of a top surface of the semiconductor substrate, by etching the first and second interlayer insulating films and the first and second sacrificial films; forming an epitaxial layer on the exposed region of the top surface of the semiconductor substrate in the first penetrating portion by epitaxial growth; forming a first electrode, which contacts a resistance change film and the epitaxial layer, in the first penetrating portion; exposing regions of side surfaces of the epitaxial layer by removing the first epitaxial film; forming an insulating film inside the exposed regions of the side surfaces of the epitaxial layer; and forming a second electrode on the exposed regions of the side surfaces of the epitaxial layer.

18 Claims, 23 Drawing Sheets

(56) References Cited

U.S. PATENT DOCUMENTS

| | | | |
|---|---|---|---|
| 2011/0149656 A1* | 6/2011 | Tang et al. | 365/185.18 |
| 2011/0194357 A1* | 8/2011 | Han et al. | 365/185.29 |
| 2012/0068256 A1* | 3/2012 | Fukuda et al. | 257/324 |
| 2012/0070944 A1* | 3/2012 | Kim et al. | 438/128 |
| 2012/0120709 A1* | 5/2012 | Mihnea et al. | 365/148 |
| 2012/0147645 A1* | 6/2012 | Scheuerlein | 365/51 |
| 2012/0161094 A1* | 6/2012 | Huo et al. | 257/4 |

* cited by examiner

NONVOLATILE MEMORY DEVICE AND METHOD OF FABRICATING THE SAME

CROSS-REFERENCE TO RELATED APPLICATION

This application claims priority from Korean Patent Application No. 10-2011-0077439 filed on Aug. 3, 2011 in the Korean Intellectual Property Office, the disclosure of which is incorporated herein by reference in its entirety.

BACKGROUND

1. Field of the Invention

The present invention relates to a nonvolatile memory device and a method of fabricating the same.

2. Description of the Related Art

Semiconductor memory devices are memory devices implemented using a semiconductor, such as Si, Ge, GaAs, or InP. Semiconductor memory devices are classified as volatile memory devices or nonvolatile memory devices.

The volatile memory devices lose stored data when the power supply is interrupted. Examples of the volatile memory devices include static random access memory (SRAM) devices, dynamic random access memory (DRAM) devices, and synchronous dynamic random access memory (SDRAM) devices.

The nonvolatile memory devices retain stored data even when the power supply is interrupted. Examples of nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, and resistive memory devices (e.g., phase-change random access memory (PRAM) devices, ferroelectric random access memory (FRAM) devices, and resistive random access memory (RRAM) devices).

SUMMARY

As the integration density of memory devices increases, vertically stacked nonvolatile memory devices are being actively researched to increase the integration density. To drive a vertically stacked nonvolatile memory device, a transistor that controls memory cells on a predetermined unit-by-unit basis (e.g., on a page-by-page basis or a section-by-section basis) may be required. In the vertically stacked nonvolatile memory device, however, it may not be easy to form the transistor while connecting the transistor and wirings in a reliable manner. Therefore, research into the formation of such a transistor is being continuously conducted.

Aspects of embodiments of the present invention provide a method of fabricating a nonvolatile memory device including a transistor that controls memory cells on a predetermined unit-by-unit basis.

Aspects of the present invention also provide a nonvolatile memory device including a transistor that controls memory cells on a predetermined unit-by-unit basis.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, there is provided a method of fabricating a nonvolatile memory device, the method comprising: sequentially stacking a first interlayer insulating film, a first sacrificial film, a second interlayer insulating film, and a second sacrificial film on a semiconductor substrate; forming a first penetrating portion, which exposes a region of a top surface of the semiconductor substrate, by etching the first and second interlayer insulating films and the first and second sacrificial films; forming an epitaxial layer on the exposed region of the top surface of the semiconductor substrate in the first penetrating portion by epitaxial growth; forming a first electrode, which contacts a resistance change film and the epitaxial layer, in the first penetrating portion; exposing regions of side surfaces of the epitaxial layer by removing the first epitaxial film; forming an insulating film inside the exposed regions of the side surfaces of the epitaxial layer; and forming a second electrode on the exposed regions of the side surfaces of the epitaxial layer.

According to another aspect of the present invention, there is provided a method of fabricating a nonvolatile memory device, the method comprising: sequentially stacking a first interlayer insulating film, a first sacrificial film, a second interlayer insulating film, and a second sacrificial film on a semiconductor substrate; forming a first penetrating portion, which exposes a region of a top surface of the semiconductor substrate, by etching the first and second interlayer insulating films and the first and second sacrificial films; forming an epitaxial layer on the exposed region of the top surface of the semiconductor substrate by epitaxial growth; sequentially forming a first electrode and a third sacrificial film along the inside of walls of the first penetrating portion and a top surface of the epitaxial layer; forming a second penetrating portion, which exposes a region of the top surface of the epitaxial layer, by etching the first electrode and the third sacrificial film; forming a second electrode, which contacts the epitaxial layer, in the second penetrating portion; exposing regions of side surfaces of the epitaxial layer by removing the first sacrificial film; forming an insulating film inside the exposed regions of the side surfaces of the epitaxial layer; forming a resistance change film along a top surface of the first interlayer insulating film, the exposed regions of the side surfaces of the epitaxial layer, and a bottom surface of the second interlayer insulating film; and forming a third electrode on the resistance change film.

According to another aspect of the present invention, there is provided a nonvolatile memory device comprising: first through third interlayer insulating films separated from each other and sequentially stacked on a semiconductor substrate; a first electrode formed between the first interlayer insulating film and the second interlayer insulating film; a second electrode formed between the second interlayer insulating film and the third interlayer insulating film; a penetrating portion penetrating the first through third interlayer insulating films and the first and second electrodes; an epitaxial layer formed on the semiconductor substrate in the penetrating portion and contacting the first electrode; and a resistance change film and a third electrode formed on the epitaxial layer in the penetrating portion, wherein an insulating film, which contacts the first electrode, is formed inside the epitaxial layer, the resistance change film contacts the second electrode, and the third electrode contacts the epitaxial layer.

According to another aspect of the present invention, there is provided a nonvolatile memory device comprising: first through third interlayer insulating films separated from each other and sequentially stacked on a semiconductor substrate; a penetrating portion penetrating the first through third interlayer insulating films; an epitaxial layer formed on the semiconductor substrate in the penetrating portion; a first electrode formed on the epitaxial layer in the penetrating portion;

a first resistance change film formed along a top surface of the first interlayer insulating film, side surfaces of the epitaxial layer, and a bottom surface of the second interlayer insulating film; a second resistance change film formed along a top surface of the second interlayer insulating film, side surfaces of the first electrode, and a bottom surface of the third interlayer insulating film; a second electrode formed on the first resistance change film; and a third electrode formed on the second resistance change film, wherein an insulating film, which contacts the first resistance change film, inside the epitaxial layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use, of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a nonvolatile memory device according to an embodiment of the present invention will be described with reference to FIGS. 1 through 5.

Figure 1:
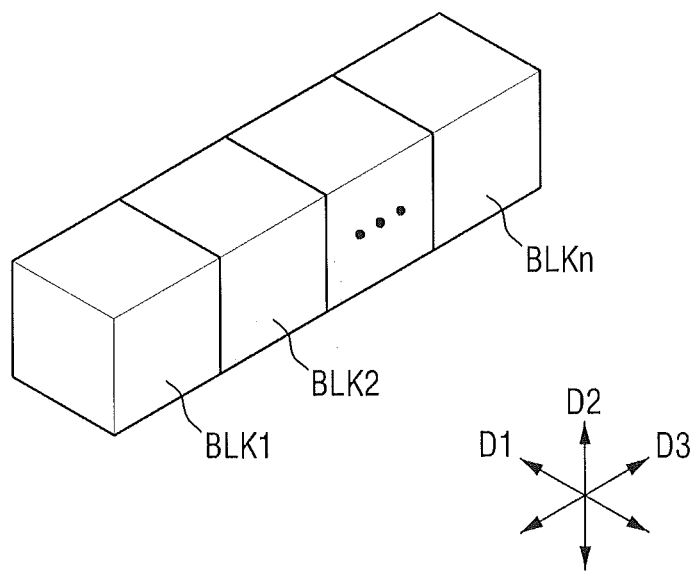
FIG. 1 is a conceptual diagram of a nonvolatile memory device according to an embodiment of the present invention.
Figure 2:
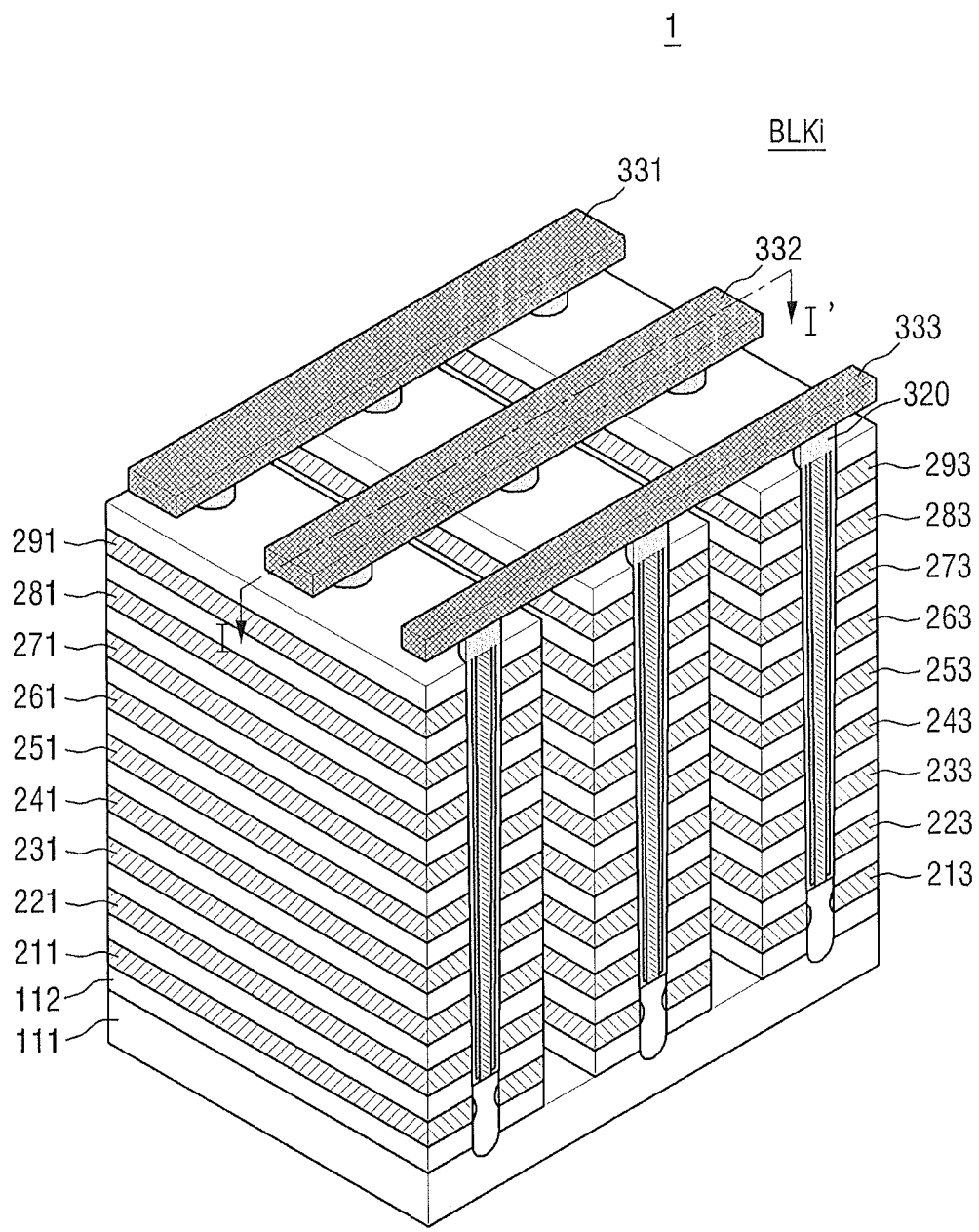
FIG. 2 is a perspective view of a memory block shown in FIG. 1.
Figure 2:
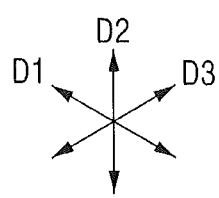
Figure 3:
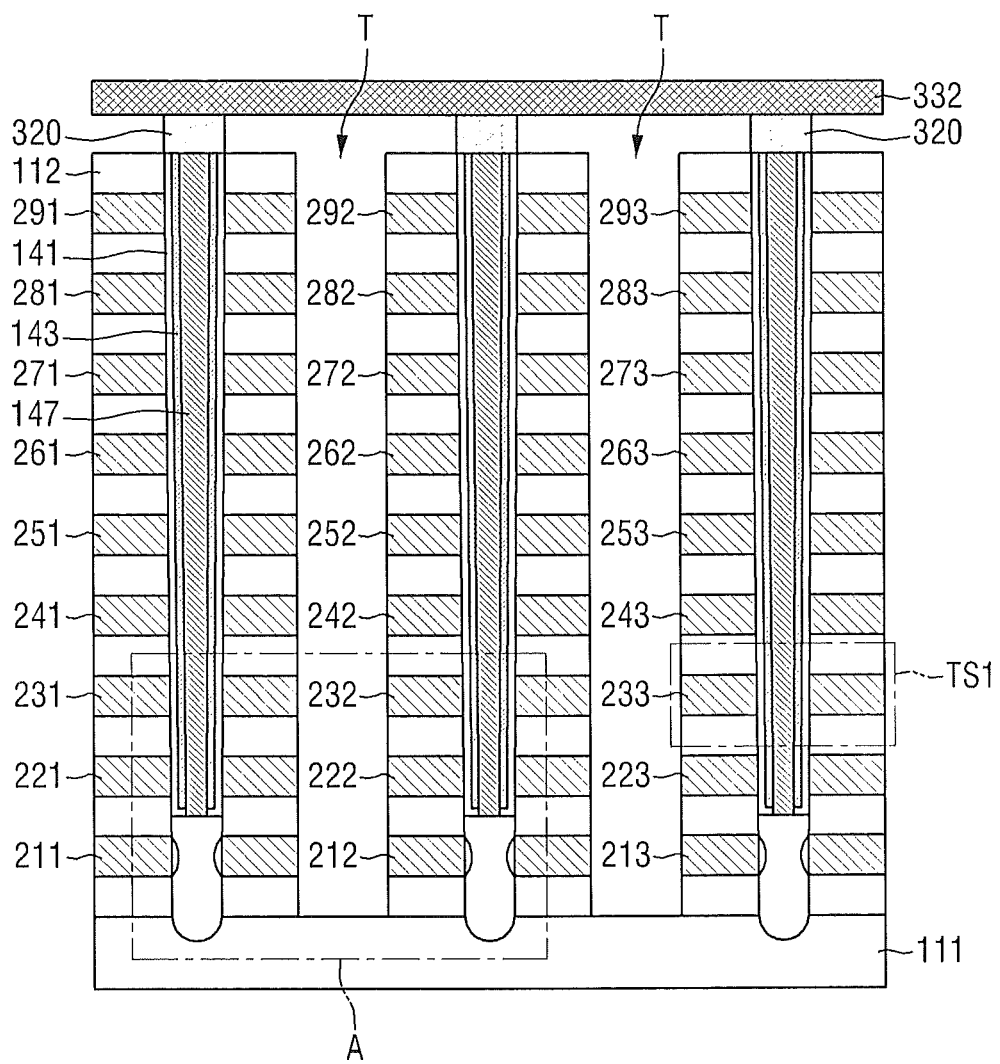
FIG. 3 is a cross-sectional view taken along the line I-I' of FIG. 2.
Figure 4:
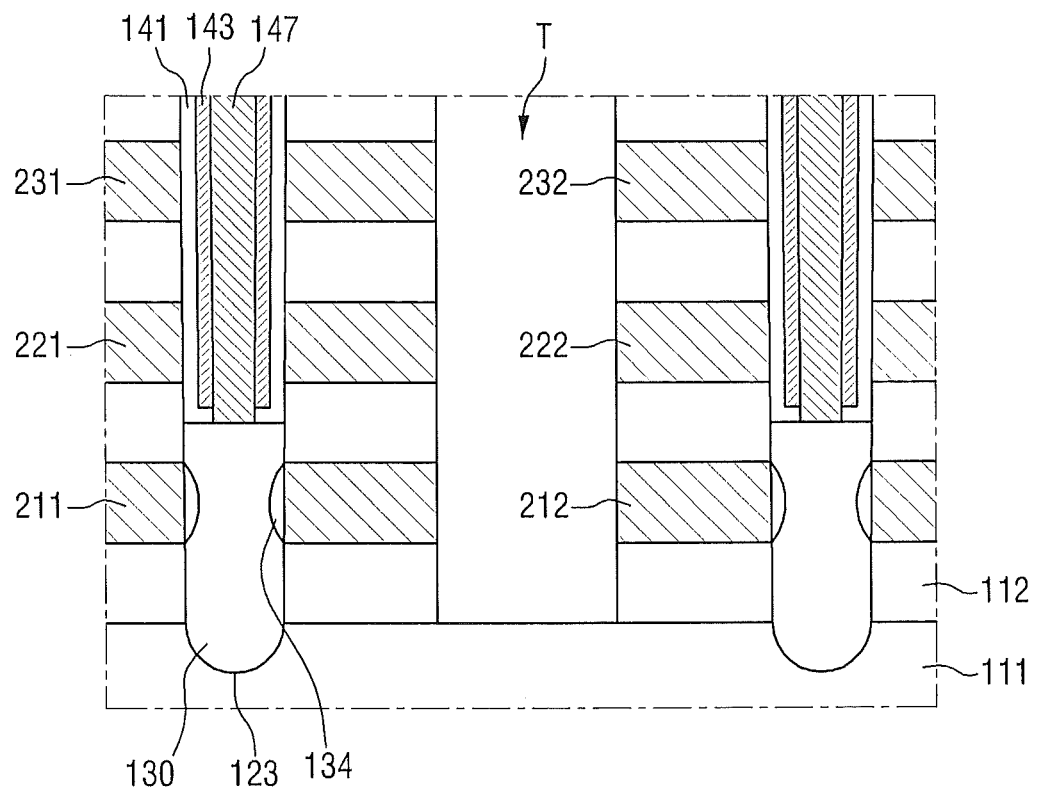
FIG. 4 is a detailed enlarged view of a region A shown in FIG. 3.
Figure 5:
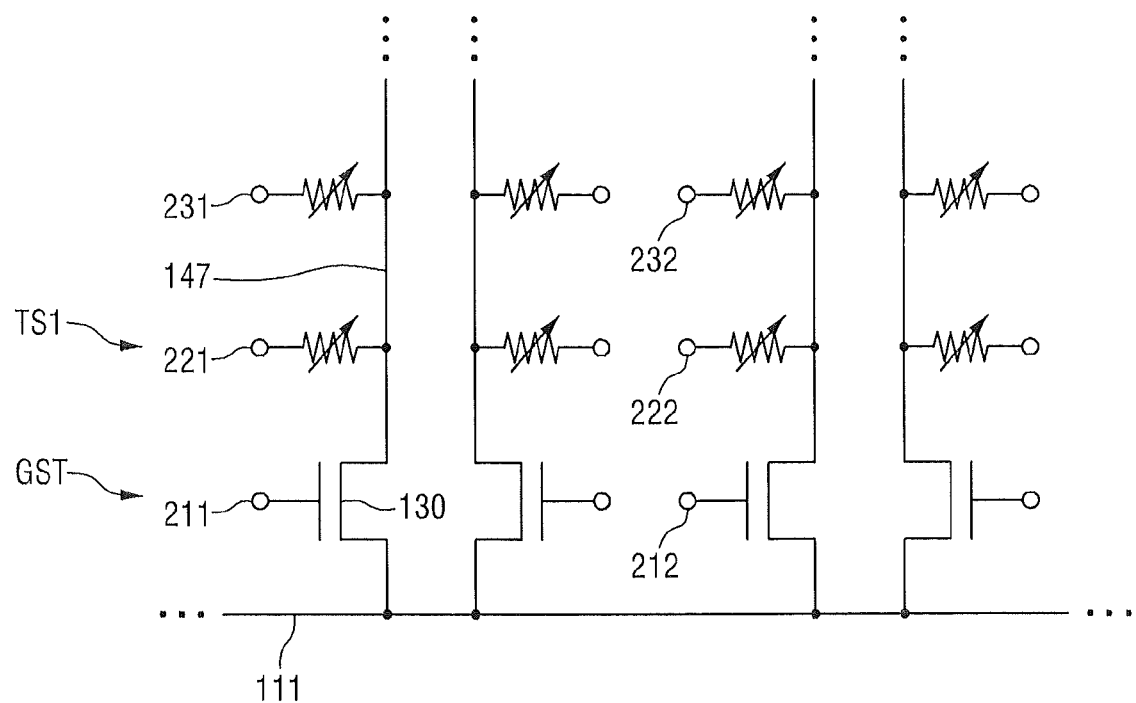
FIG. 5 is a circuit diagram of a transistor shown in FIG. 4.

FIG. 1 is a conceptual diagram of a nonvolatile memory device 1 according to an embodiment of the present invention. FIG. 2 is a perspective view of a memory block shown in FIG. 1. FIG. 3 is a cross-sectional view taken along the line I-I' of FIG. 2. FIG. 4 is a detailed enlarged view of a region A shown in FIG. 3. FIG. 5 is a circuit diagram of a transistor shown in FIG. 4.

In the present specification, a resistive random access memory (RRAM), which stores data using the resistance change of a resistance change film, will be described as an example of a nonvolatile memory device. However, embodiments of the present invention are not limited thereto.

Referring to FIG. 1, a memory cell array of the nonvolatile memory device 1 according to the current embodiment may include a plurality of memory blocks BLK1 through BLKn, where n is a natural number. Each of the memory blocks BLK1 through BLKn may extend in first through third directions D1 through D3. As shown in the drawing, the first through third directions D1 through D3 may be directions that intersect each other or directions that are different from each other. For example, the first through third directions D1 through D3 may be, but are not limited to, directions that intersect each other at right angles.

Referring to FIGS. 2 through 4, a memory block BLKi (1<i<n, where i is a natural number) may include a plurality of interlayer insulating films 112, a plurality of first and second electrodes 143 and 147, a plurality of third electrodes 211 through 291, 212 through 292 and 213 through 293, and a plurality of resistance change films 141 formed on a substrate 111.

The interlayer insulating films 112 may be separated from each other in the second direction D2 and may be sequentially stacked on the semiconductor substrate 111 in the second direction D2. As shown in FIG. 2, each of the interlayer insulating films 112 may extend in the first direction D1.

The first and second electrodes 143 and 147 may extend in the second direction D2. Specifically, the first and second electrodes 143 and 147 may be formed in each penetrating portion 121 (see FIG. 7) which penetrates the interlayer insulating films 112. Here, the first and second electrodes 143 and 147 may be disposed on an epitaxial layer 130 in the form of a pillar. The first and second electrodes 143 and 147 may penetrate the interlayer insulating films 112 and each group of the third electrodes 211 through 291, 212 through 292 or 213 through 293 and contact each bit line contact 320.

The first and second electrodes 143 and 147 may be arranged in the third direction D3 and may be electrically connected to each other by bit lines 331 through 333. That is, the first and second electrodes 143 and 147 arranged in the third direction D3 may share the bit lines 331 through 331

Referring to FIGS. 2 and 3, the first and second electrodes 143 and 147 may be separated from each other in the first direction D1 and the third direction D3. That is, the first and second electrodes 143 and 147 may be arranged in a matrix configuration. In the drawings, the first and second electrodes 143 and 147 are arranged in a 3×3 matrix configuration. However, embodiments of the present invention are not limited thereto.

Figure 7:
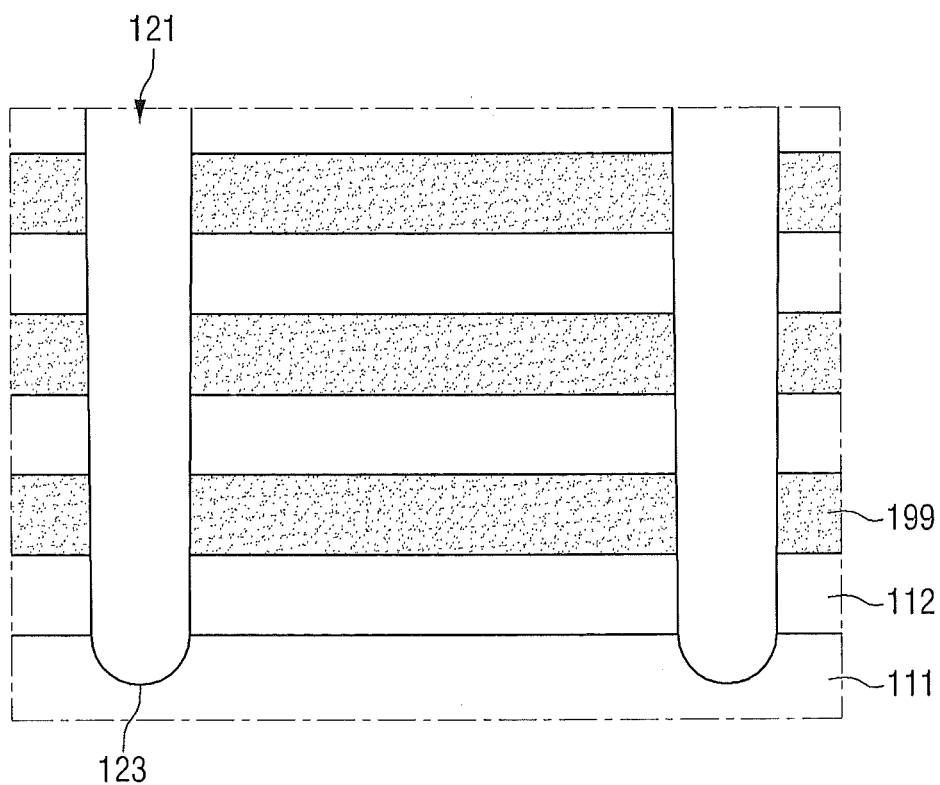

The epitaxial layer 130 may be formed on the semiconductor substrate 111 and under the first and second electrodes 143 and 147 in each penetrating portion 121 (see FIG. 7). Specifically, the epitaxial layer 130 may be formed in each penetrating portion 121 (see FIG. 7), and more specifically, may be formed in and on a first trench 123 formed in the semiconductor substrate 111.

A top surface of the epitaxial layer 130 may be higher than those of the third electrodes 211, 212 and 213. The top surface of the epitaxial layer 130 may be lower than bottom surfaces of the third electrodes 221, 222 and 223.

While the top surface of the epitaxial layer 130 is higher than those of the third electrodes 211, 212 and 213 and lower than the bottom surfaces of the third electrodes 221, 222 and 223 in the drawings, embodiments of the present invention are not limited thereto. When necessary, the top surface of the epitaxial layer 130 may be higher than those of the third electrodes 221, 222 and 223 and lower than bottom surfaces of the third electrodes 231, 232 and 233.

The epitaxial layer 130 may be formed on the semiconductor substrate 111 by selective epitaxial growth (SEG). Examples of the epitaxial layer 130 may include, but not limited to, a Si epitaxial layer, a Ge epitaxial layer, a C epitaxial layer, a SiGe epitaxial layer and a SiC epitaxial layer. As shown in the drawings, the epitaxial layer 130 may not contact each of the first electrodes 143, but may contact each of the second electrodes 147.

The third electrodes 211 through 291, 212 through 292 and 213 through 293 may extend in the first direction D1. Specifically, each group of the third electrodes 211 through 291, 212 through 292 or 213 through 293 may be formed between the stacked interlayer insulating films 112 and may intersect the first and second electrodes 143 and 147 and the epitaxial layer 130.

An insulating film 134 may be formed in the epitaxial layer 130, which contacts each of the third electrodes 211, 212 and 213. The insulating film 134 may be, for example, an oxide film. Specifically, the insulating film 134 may be an oxide film formed by, e.g., heat oxidation of the epitaxial layer 130. More specifically, the insulating film 134 may be an SiO2 film formed by heat oxidation of the Si epitaxial layer 130.

Each group of the third electrodes 221 through 291, 222 through 292 or 223 through 293 arranged in the second direction D2 may share the first and second electrodes 143 and 147 and a corresponding one of the resistance change films 141.

An isolation trench T may be formed in the interlayer insulating films 112 between the first and second electrodes 143 and 147 arranged in the third direction D3. Side surfaces of each group of the third electrodes 211 through 291, 212 through 292 or 213 through 293, which are exposed by the isolation trench T may be aligned with side surfaces of the interlayer insulating films 112, which are exposed by the isolation trench T.

At least one of the first through third electrodes 143, 147, 211 through 291, 212 through 292 and 213 through 293 may be made of metal. The first and second electrodes 143 and 147 may be, but are not limited to, Ru, RuOx, Ti/TiN, Zr/TiN, NiSix, TiN, Wn, W, Al, Cu, or an alloy of these materials. In addition, the third electrodes 211 through 291, 212 through 292 and 213 through 293 may be, but are not limited to, Ti/TiN, Ta/TiN, W, Pt, Pd, Rh, Ru, Ir, or an alloy of these materials.

Although not shown in the drawings, at least one of the first through third electrodes 143, 147, 211 through 291, 212 through 292 and 213 through 293 may have a double layer structure composed of a conductive film (not shown) and a diffusion preventing film (not shown). Specifically, at least one of the first through third electrodes 143, 147, 211 through 291, 212 through 292 and 213 through 293 may have a double layer structure composed of a conductive film (not shown) made of a conductive material and a diffusion preventing film (not shown), which prevents or reduces diffusion of the conductive material.

Each of the resistance change films 141 may be interposed between the first and second electrodes 143 and 147 and a corresponding group of the third electrodes 211 through 291, 212 through 292 or 213 through 293. The resistance change films 141 may extend parallel to the first electrodes 143 along side surfaces of the first electrodes 143 in the second direction D2.

The resistance change films 141 may be, for example, transition metal oxide (TMO). Specifically, TMO may be, but is not limited to, HfOx, TiOx, TaOx, ZnO, Ti$_2$O, Nb$_2$O$_5$, ZrO$_2$, or NiO. In the drawings, each of the resistance change films 141 is a single film. However, when necessary, each of the resistance change films 141 may be formed as a multifilm such as a double or triple film. In addition, when necessary, an oxide film (not shown) (e.g., SiO2) may be additionally formed between each of the resistance change films 141 and the interlayer insulating films 112 or between each of the resistance change films 141 and a corresponding group of the third electrodes 211 through 291, 212 through 292 or 213 through 293.

In regions in which the first and second electrodes 143 and 147 intersect the third electrodes 211 through 291, 212 through 292 and 213 through 293, nonvolatile memory cells TS1 may be defined. In a region in which the epitaxial layer 130 formed on the semiconductor substrate 111 intersects each group of the third electrodes 211 through 291, 212 through 292 or 213 through 293, a transistor that can control the nonvolatile memory cells TS1 thereon may be defined. The transistor may be, but is not limited to, a ground voltage selection transistor (GST) which controls the application of a ground voltage received from the semiconductor substrate 111 to the nonvolatile memory cells TS1 thereon.

Specifically, referring to FIGS. 4 and 5, the epitaxial layer 130 serves as the body of the transistor GST, and the third electrode 211 which contacts the epitaxial layer 130 serves as a gate electrode of the transistor GST. In addition, the insulating film 134 formed at contact surfaces between the epitaxial layer 130 and the third electrode 211 serves as a gate insulating film of the transistor GST.

It may be assumed that a ground voltage is applied to the semiconductor substrate 111. In this case, if a voltage higher than a threshold voltage is applied to the third electrode 211, a channel is formed in the epitaxial layer 130. Accordingly, the ground voltage applied to the semiconductor substrate 111 is delivered to the second electrode 147 or the first electrode 143 and then to the nonvolatile memory cells TS1, which share the second electrode 147 or the first electrode 143.

Conversely, if a voltage lower than the threshold voltage is applied to the third electrode 211, no channel is formed in the epitaxial layer 130. Therefore, the ground voltage applied to the semiconductor substrate 111 is not delivered to the second electrode 147 or the first electrode 143. Accordingly, the ground voltage is not delivered to the nonvolatile memory cells TS1 which share the second electrode 147 or the first electrode 143.

In summary, the epitaxial layer 130, each of the third electrodes 211 and 212, and the insulating film 134 serve as the transistor GST which controls whether to deliver the ground voltage received from the semiconductor substrate 111 to the nonvolatile memory cells TS1 disposed thereon. That is, the nonvolatile memory device 1 according to the current embodiment may include the transistor GST, which is reliably connected to wirings (such as the semiconductor substrate 111 and the second electrode 147 or the first electrode 143) in a vertically stacked structure and controls the nonvolatile memory cells TS1 on a predetermined unit-by-unit basis (e.g., on a page-by-page basis or a section-by-section basis).

The nonvolatile memory device 1 according to the current embodiment can be fabricated using various methods. As an example, methods of fabricating the nonvolatile memory device 1 according to the embodiment of FIG. 1 and a nonvolatile memory device according to a modified embodiment of the embodiment of FIG. 1 will be described with reference to FIGS. 6 through 14.

FIGS. 6 through 14 are views illustrating intermediate processes in methods of fabricating the nonvolatile memory device 1 according to the embodiment of FIG. 1 and a nonvolatile memory device 2 according to a modified embodiment of the embodiment of FIG. 1.

Figure 6:
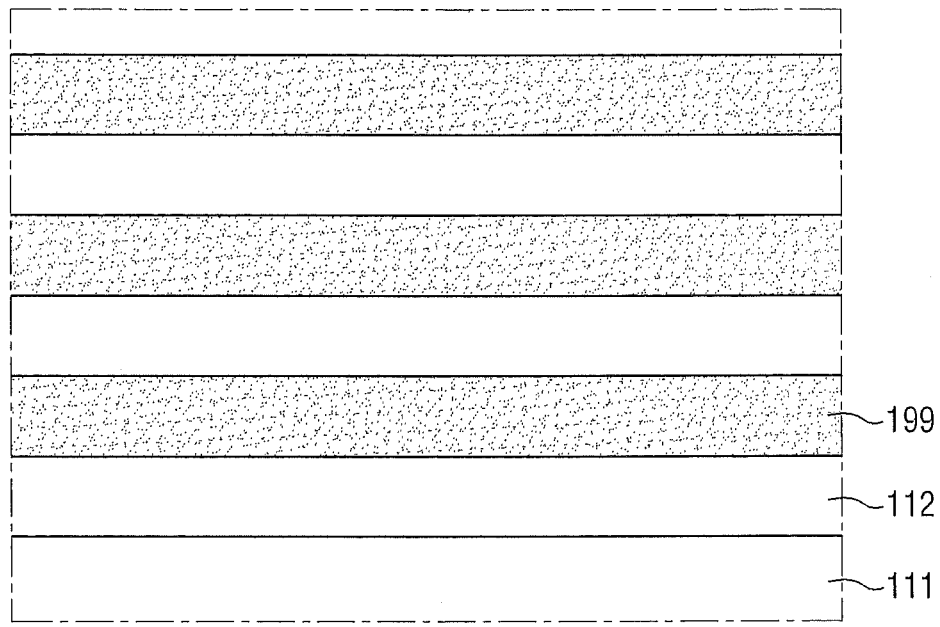
FIGS. 6 through 14 are views illustrating intermediate processes in methods of fabricating the nonvolatile memory device 1 according to the embodiment of FIG. 1 and a nonvolatile memory device 2 according to a modified embodiment of the embodiment of FIG. 1.

Referring to FIG. 6, a plurality of interlayer insulating films 112 and a plurality of first sacrificial films 199 are stacked alternately on a semiconductor substrate 111. The first sacrificial films 199 and the interlayer insulating films 112 may be materials having different etch rates. For example, the first sacrificial films 199 may be nitride films, and the interlayer insulating films 112 may be oxide films.

Referring to FIG. 7, the interlayer insulating films 112 and the first sacrificial films 199 are etched to form a first penetrating portion 121, which exposes a region of a top surface of the semiconductor substrate 111. Here, the semiconductor substrate 111 may be over-etched to form a first trench 123 therein, Referring to FIG. 8, an epitaxial layer 130 is formed on the exposed region (e.g., in and on the first trench 123) of the top surface of the semiconductor substrate 111 by epitaxial growth. In the current embodiment, the epitaxial layer 130 may be formed by SEG. Therefore, when the epitaxial layer 130 is, for example, a Si epitaxial layer, crystals of the epitaxial layer 130 may grow from the top surface of the semiconductor substrate 111, but may not grow from side surfaces of the interlayer insulating films 112 or side surfaces of the first sacrificial films 199.

A top surface P of the epitaxial layer 130 thus formed may be higher than a top surface Q of a first sacrificial film 199 closest to the semiconductor substrate 111 and may be lower than a bottom surface R of a first sacrificial film 199 next closest to the semiconductor substrate 111.

Figure 8:
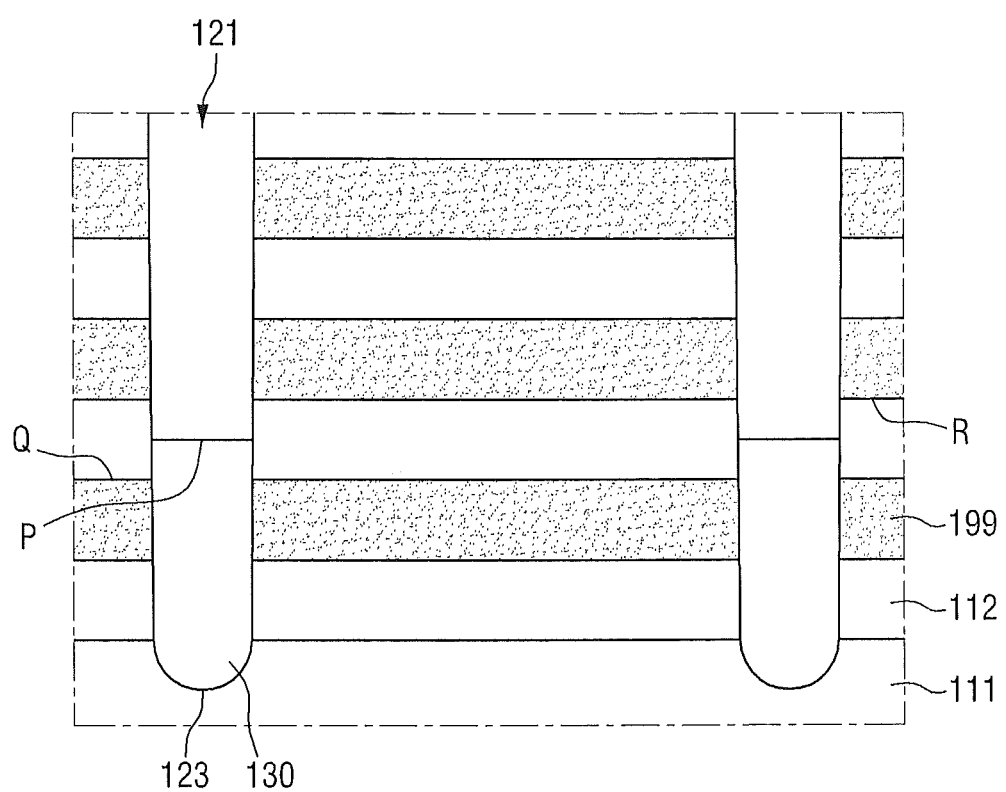
Figure 9:
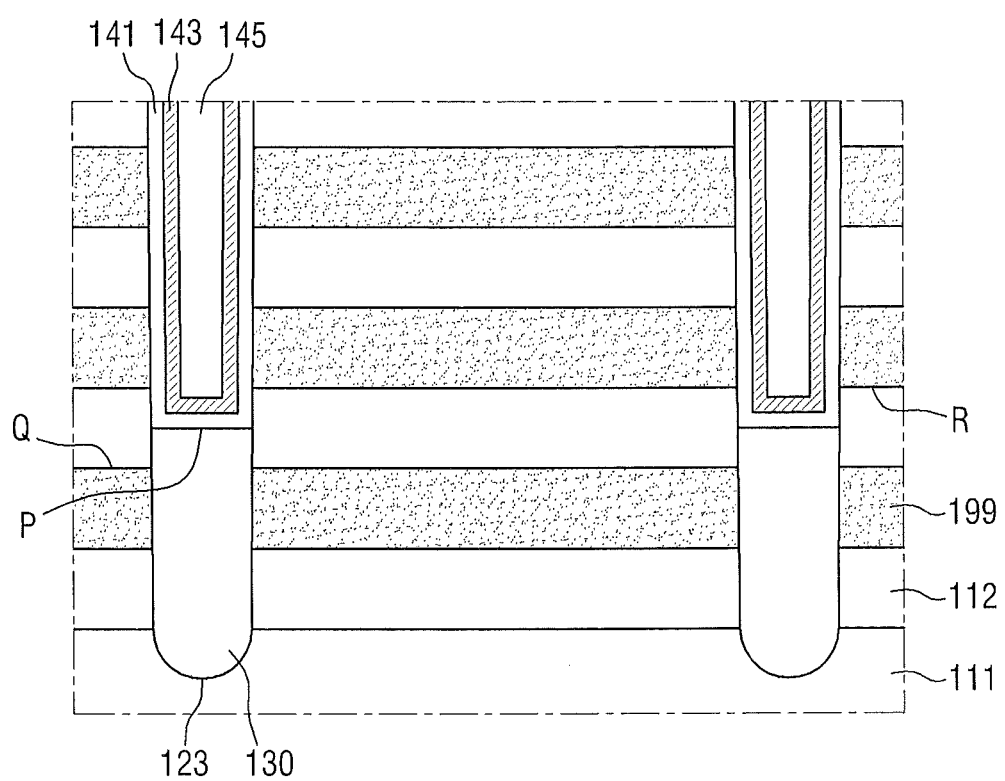

Referring to FIG. 9, a resistance change film 141, a first electrode 143 and a second sacrificial film 145 are sequentially formed along the inside of walls of the first penetrating portion 121 (see FIG. 8) and the top surface P of the epitaxial layer 130. Specifically, the resistance change film 141, the first electrode 143 and the second sacrificial film 145 may be sequentially formed along the inside of the walls of the first penetrating portion 121 (see FIG. 8) and the top surface P of the epitaxial layer 130 by chemical vapor deposition (CVD), physical vapor deposition (PVD), or atomic layer deposition (ALD). Although not shown in the drawing, an oxide film (e.g., SiO2) (not shown) may additionally be formed between the interlayer insulating films 112 or the sacrificial films 199 and the resistance change film 141, The resistance change film 141 may be, for example, TMO, and the TMO may be, but is not limited to, HfOx, TiOx, TaOx, ZnO, Ti$_2$O, Nb$_2$O$_5$, ZrO$_2$, or NiO. The first electrodes 143 may be, for example, metal, and the metal may be, but is not limited to, Ru, RuOx, Ti/TiN, Zr/TiN, NiSix, TiN, Wn, W, Al, Cu, or an alloy of these materials. Although not shown in the drawing, the first electrode 143 may have a double layer structure composed of a conductive film (not shown) and a diffusion preventing film (not shown). The second sacrificial film 145 may be, for example, a nitride film, and an example of the nitride film may be, but is not limited to, SiN.

Figure 10:
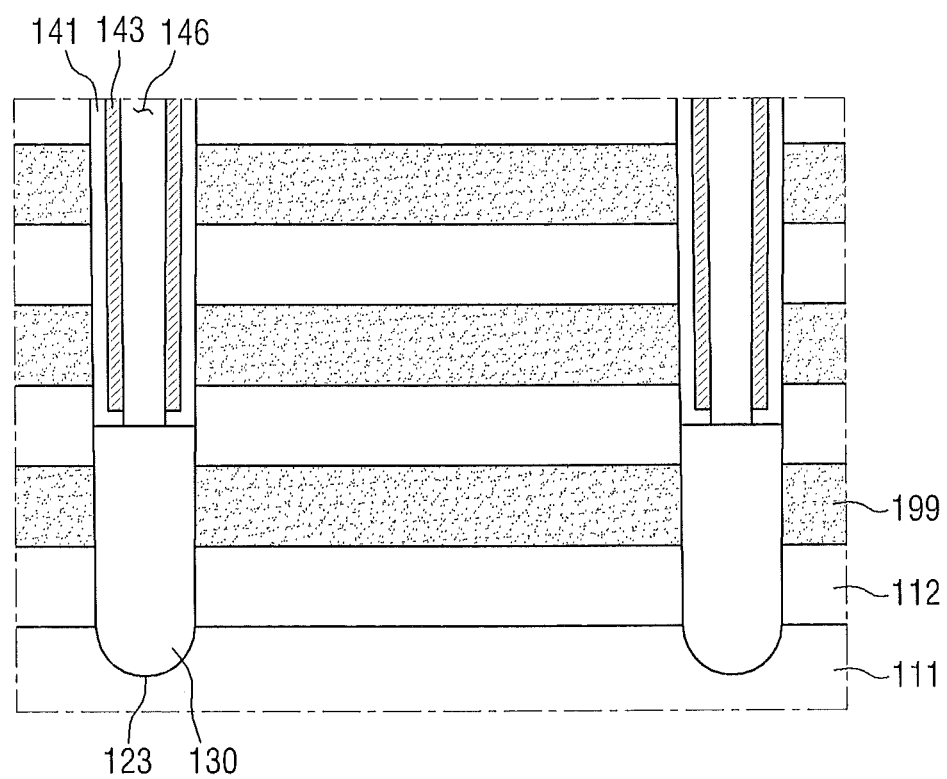

Referring to FIG. 10, the resistance change film 141, the first electrode 143 and the second sacrificial film 145 are etched to form a second penetrating portion 146 which exposes a region of the top surface of the epitaxial layer 130. To increase the contact capability between a second electrode 147 (see FIG. 12), which is to be formed in the second penetrating portion 146, and the epitaxial layer 130, the inside of the second penetrating portion 146 and the top surface of the epitaxial layer 130 may be cleaned.

Figure 11:
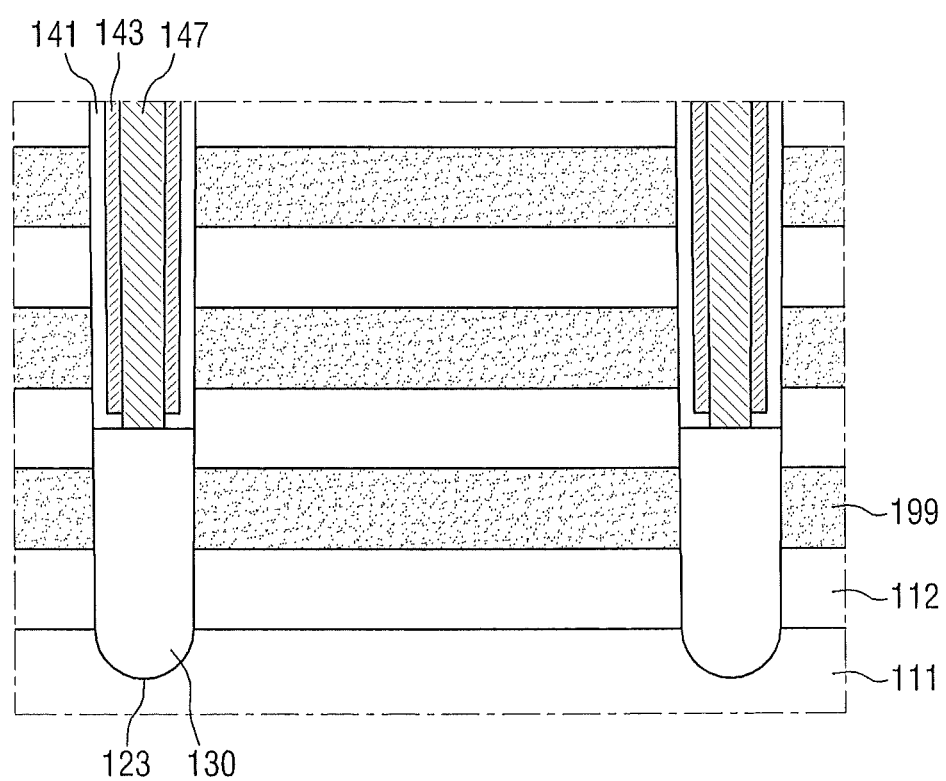
Figure 12:
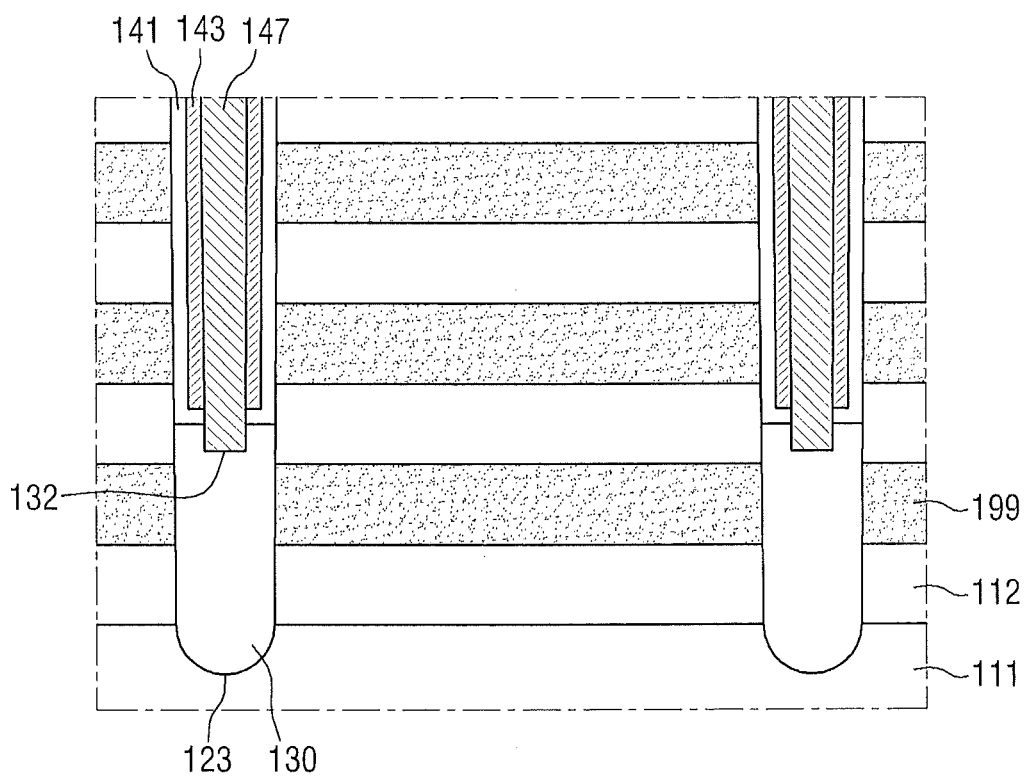

Referring to FIG. 11, the second electrode 147 which contacts the epitaxial layer 130 is formed within the second penetrating portion 146 (see FIG. 10). The second electrode 147 may metal, and the metal may be, but is not limited to, Ru, RuOx, Ti/TiN, Zr/TiN, NiSix, TiN, Wn, W, Al, Cu, or an alloy of these materials. Although not shown in the drawing, like the first electrode 143, the second electrode 147 may have a double layer structure composed of a conductive film (not shown) and a diffusion preventing film (not shown).

The second electrode 147 may have a different shape. That is, referring to FIG. 12, in the method of fabricating the nonvolatile memory device 2 according to the modified embodiment of the embodiment of FIG. 1, a second trench 132 may be formed in the epitaxial layer 130 by over-etching the epitaxial layer 130 during the formation of the second penetrating portion 146 (see FIG. 10), and the second electrode 147 may be formed in and on the second trench 132.

Figure 13:
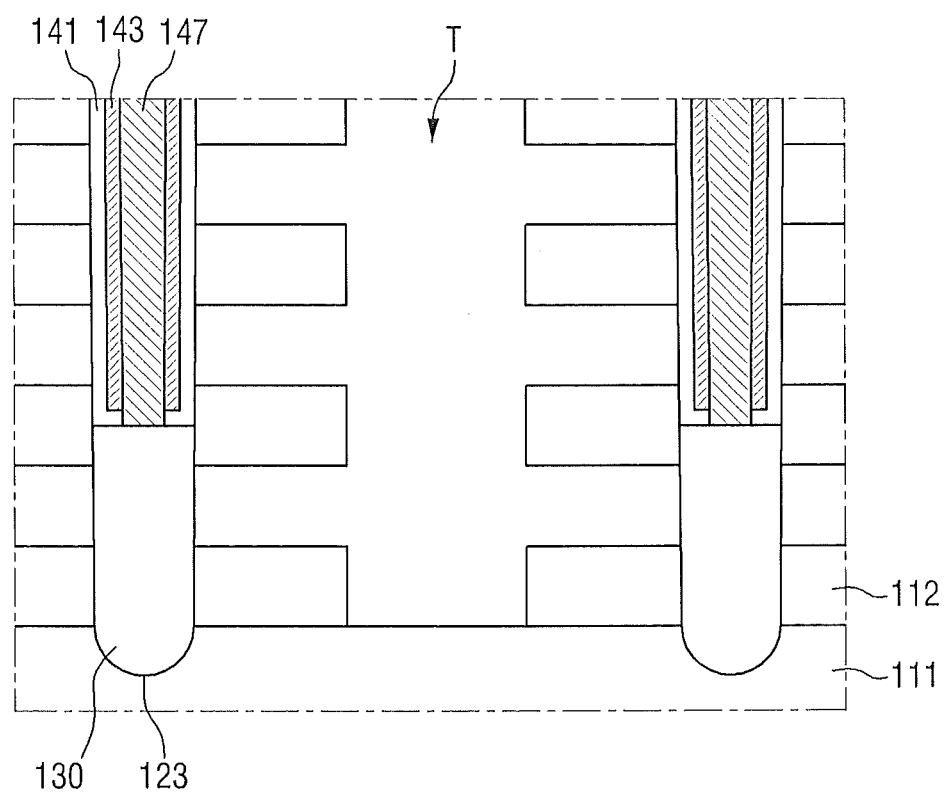

Referring to FIG. 13, the first sacrificial films 199 (see FIG. 12) are removed to expose regions of side surfaces of the epitaxial layer 130 and regions of side surfaces of the resistance change film 141.

Specifically, the first sacrificial films 199 (see FIG. 12) and part of the interlayer insulating films 112 are removed to form an isolation trench T, which is separated from the first electrode 143 and the second electrode 147. In this case, the trench T may be placed between the first electrode 143 and the second electrode 147.

The first sacrificial films 199 (see FIG. 12) are etched using an etch selectivity of the first sacrificial films 199 (see FIG. 12) with respect to the interlayer insulating films 112, the epitaxial layer 130 and the resistance change film 141. Specifically, the first sacrificial films 199 (see FIG. 12) may be removed by wet etching. The process of removing the first sacrificial films 199 (see FIG. 12) may be referred to as a pull-back process. The pull-back process may use phosphoric acid, sulfuric acid, hydrochloric acid, or a mixture of these solutions. However, embodiments of the present invention is not limited thereto.

Referring back to FIG. 13, as the first sacrificial films 199 (see FIG. 12) are removed, regions of the side surfaces of the epitaxial layer 130 and regions of the side surfaces of the resistance change film 141 are exposed. Specifically, the removal of the first sacrificial film 199 (see FIG. 12) closest to the semiconductor substrate 111 results in the exposure of regions of the side surfaces of the epitaxial layer 130. In addition, the removal of the first sacrificial film 199 (see FIG.

12) results in the exposure of regions of the side surfaces of the resistance change film 141.

Figure 14:
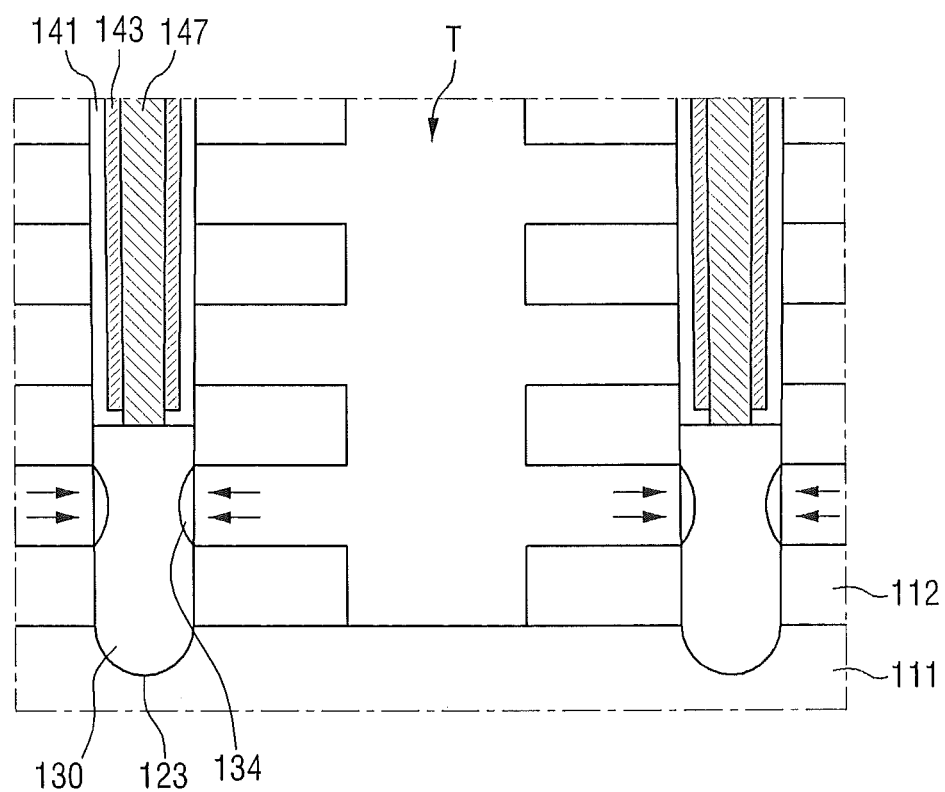

Referring to FIG. 14, an insulating film 134 is formed inside the exposed regions of the side surfaces of the epitaxial layer 130. Specifically, the insulating film 134 may be an oxide film formed inside the epitaxial layer 130 by heat oxidation of the exposed regions of the side surfaces of the epitaxial layer 130. More specifically, the insulating film 134 may be an SiO2 film formed inside the epitaxial layer 130 by heat oxidation of the exposed regions of the side surfaces of the Si epitaxial layer 130.

Referring to FIG. 14, each group of a plurality of third electrodes 211 through 291, 212 through 292 or 213 through 293 are formed on the exposed regions of the side surfaces of the epitaxial layer 130 and the exposed regions of the side surfaces of the resistance change film 141. Specifically, a conductive material is formed on the exposed regions of the side surfaces of the epitaxial layer 130 and the exposed regions of the side surfaces of the resistance change film 141 and fills the isolation trench T. Then, the isolation trench T is formed again, thereby forming each group of the third electrodes 211 through 291, 212 through 292 or 213 through 293 on the exposed regions of the side surfaces of the epitaxial layer 130 and the exposed regions of the side surfaces of the resistance change film 141. Here, side surfaces of each group of the third electrodes 211 through 291, 212 through 292 or 213 through 293 which are exposed by the isolation trench T may be aligned with the side surfaces of the interlayer insulating films 112 which are exposed by the isolation trench T.

The third electrodes 211 through 291, 212 through 292 and 213 through 293 may be, e.g., metal, and the metal may be, but is not limited to, Ti/TiN, Ta/TiN, W, Pt, Pd, Rh, Ru, Ir, or an alloy of these materials.

Hereinafter, a nonvolatile memory device according to another embodiment of the present invention will be described with reference to FIGS. 15 and 16.

Figure 15:
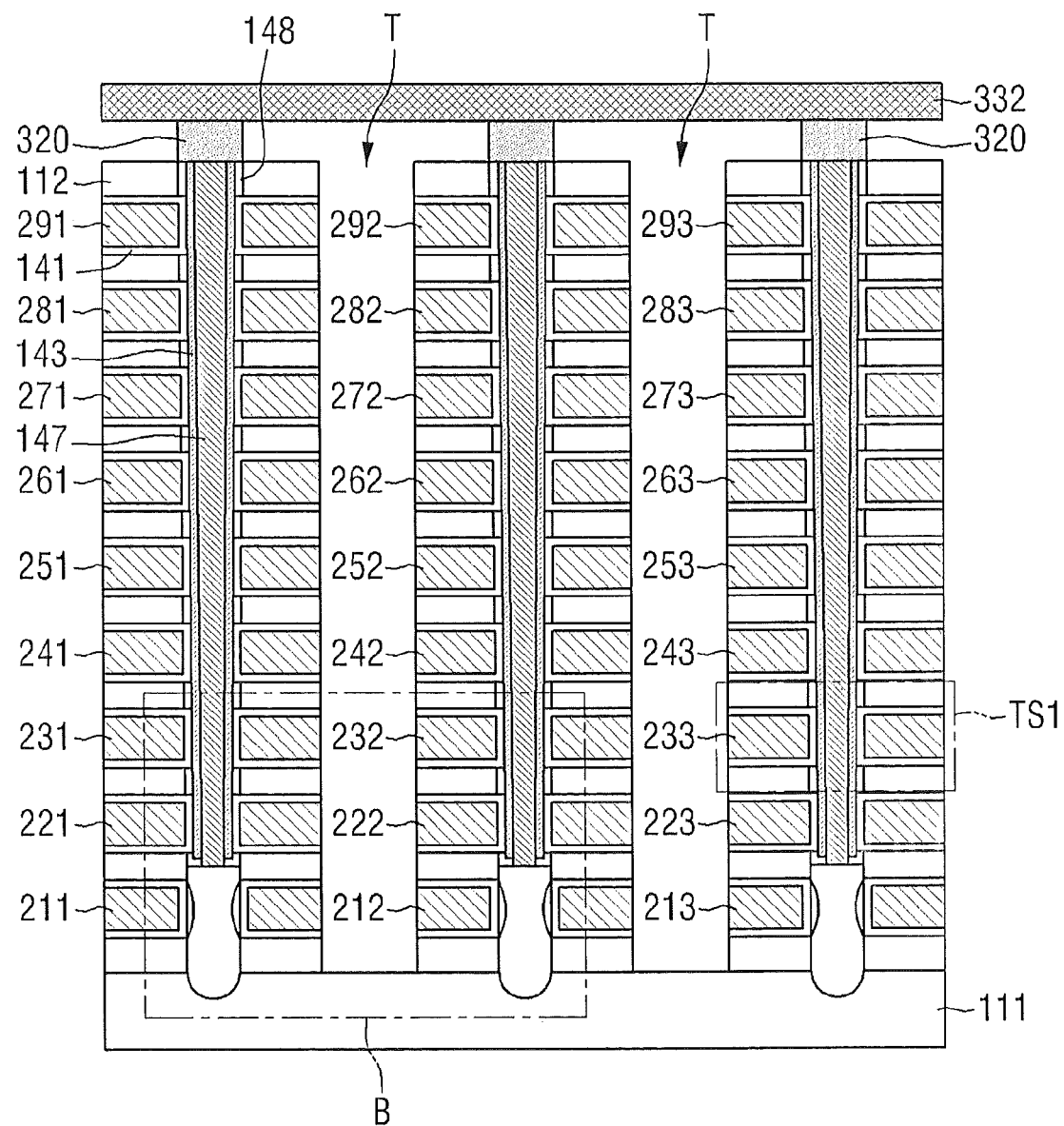
FIG. 15 is a cross-sectional view of a nonvolatile memory device according to another embodiment of the present invention.

FIG. 15 is a cross-sectional view of a nonvolatile memory device 3 according to another embodiment of the present invention. FIG. 16 is a detailed enlarged view of a region B shown in FIG. 15. The following description will focus on differences form the above-described embodiments. Like reference numerals in the drawings denote like elements.

Figure 16:
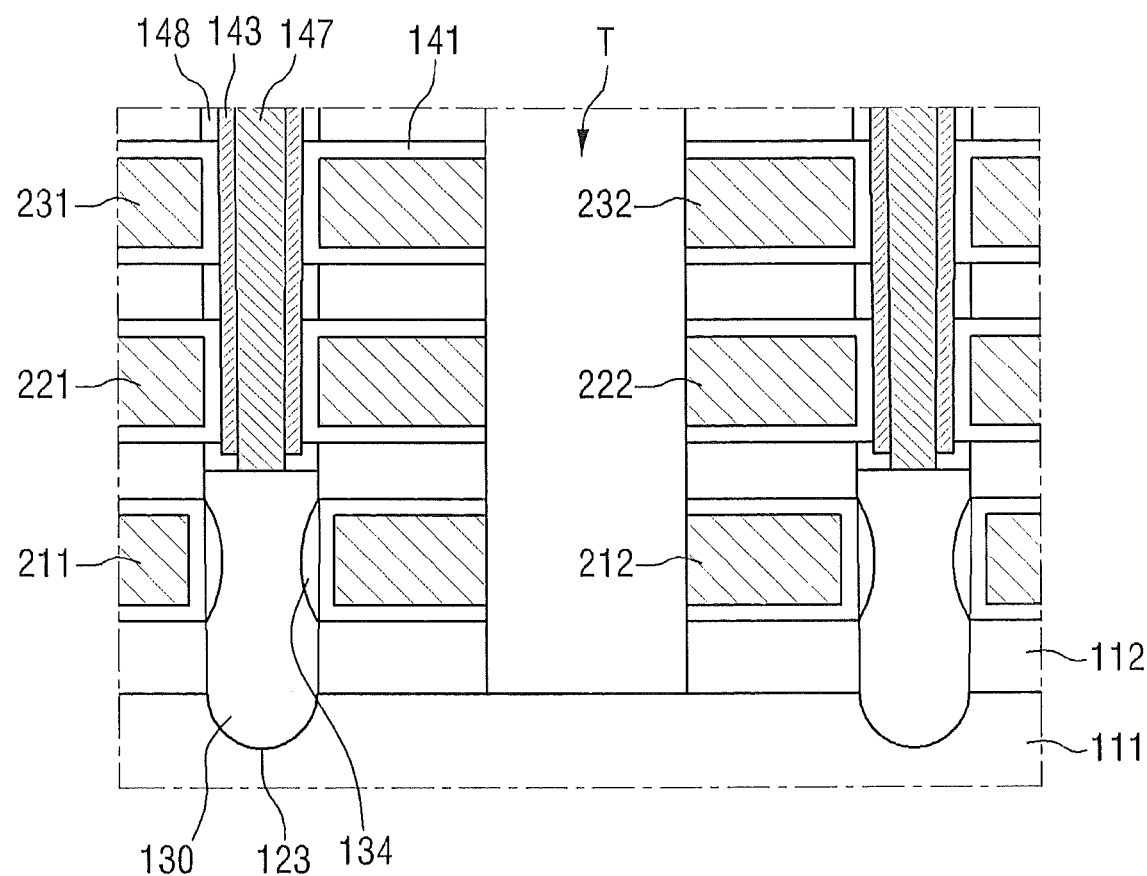
FIG. 16 is a detailed enlarged view of a region B shown in FIG. 15.

Referring to FIGS. 15 and 16, a resistance change film 141 of the nonvolatile memory device 3 according to the current embodiment is formed along a top surface of an interlayer insulating film 112 disposed thereunder, side surfaces of an epitaxial layer 130 or side surfaces of a first electrode 143, and a bottom surface of an interlayer insulating film 112 thereon. That is, the resistance change film 141 surrounds each of a plurality of third electrodes 211 through 291, 212 through 292, and 213 through 293.

An oxide film 148 (e.g., a SiO2 film) is formed between the first electrode 143 and the interlayer insulating films 112. However, the oxide film 148 may be excluded in other embodiments.

Other elements of the nonvolatile memory device 3 are identical to those of the previous embodiments, and thus a detailed description thereof will be omitted.

The nonvolatile memory device 3 according to the current embodiment can be fabricated using various methods. As an example, a method of fabricating the nonvolatile memory device 3 according to the embodiment of FIG. 15 will be described.

FIGS. 17 through 22 are views illustrating intermediate processes in a method of fabricating the nonvolatile memory device 3 according to the embodiment of FIG. 15.

Referring to FIGS. 6 through 8, a plurality of interlayer insulating films 112 and a plurality of first sacrificial films 199 are stacked alternately on a semiconductor substrate 111. Then, the interlayer insulating films 112 and the first sacrificial films 199 are etched to form a first penetrating portion 121, which exposes a region of a top surface of the semiconductor substrate 111. An epitaxial layer 130 is formed on the exposed region (e.g., in and on a first trench 123) of the top surface of the semiconductor substrate 111 by epitaxial growth.

Figure 17:
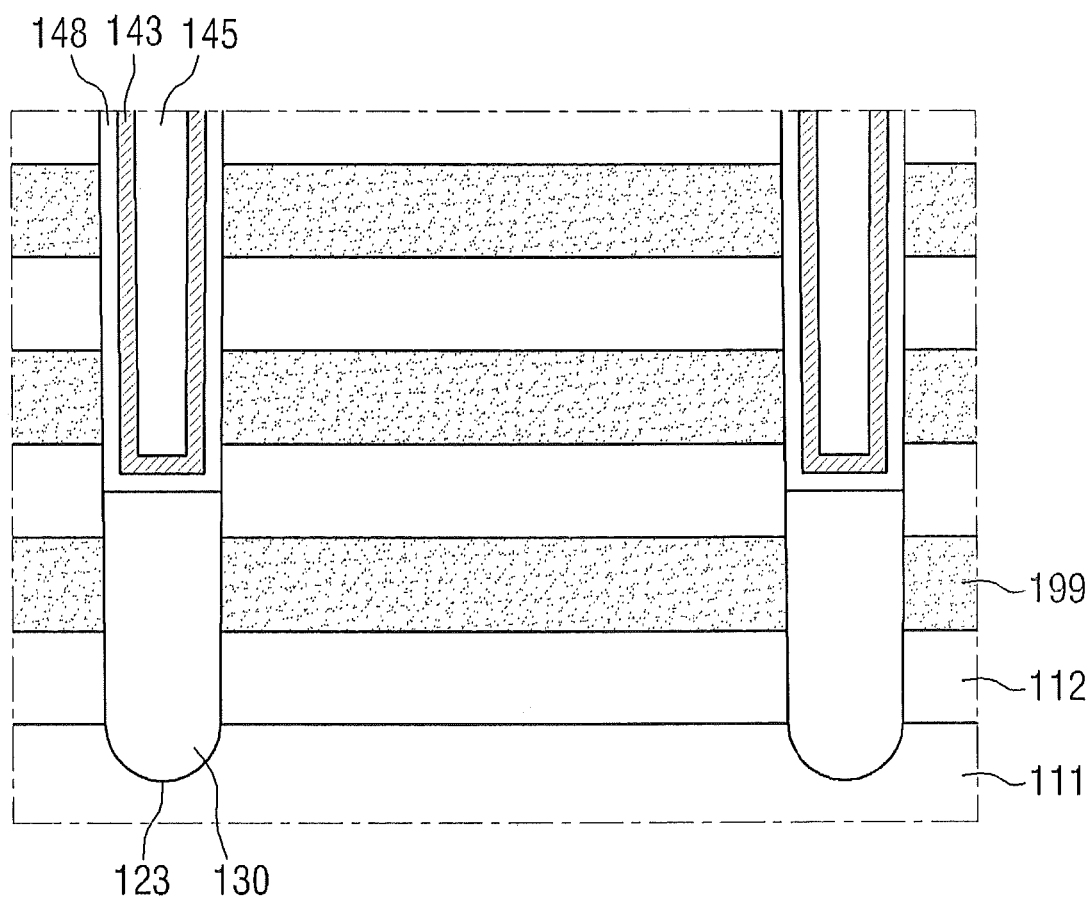
FIGS. 17 through 22 are views illustrating intermediate processes in a method of fabricating the nonvolatile memory device according to according to the embodiment of FIG. 15.

Referring to FIG. 17, an oxide film 148, a first electrode 143 and a second sacrificial film 145 are sequentially formed along the inside of walls of the first penetrating portion 121 (see FIG. 8) and the top surface of the epitaxial layer 130 by CVD, PVD or ALD.

Figure 18:
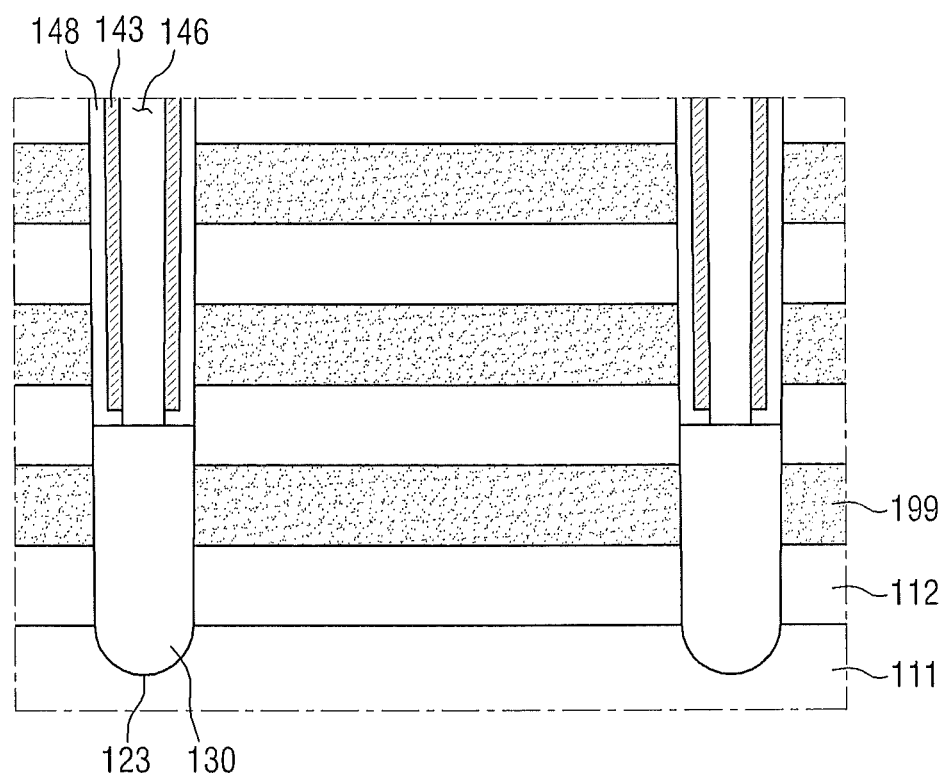

Referring to FIG. 18, the oxide film 148, the first electrode 143 and the second sacrificial film 145 are etched to form a second penetrating portion 146 which exposes a region of the top surface of the epitaxial layer 130. To increase the contact capability between a second electrode 147 (see FIG.19), which is to be formed in the second penetrating portion 146, and the epitaxial layer 130, the inside of the second penetrating portion 146 and the top surface of the epitaxial layer 130 may be cleaned.

Figure 19:
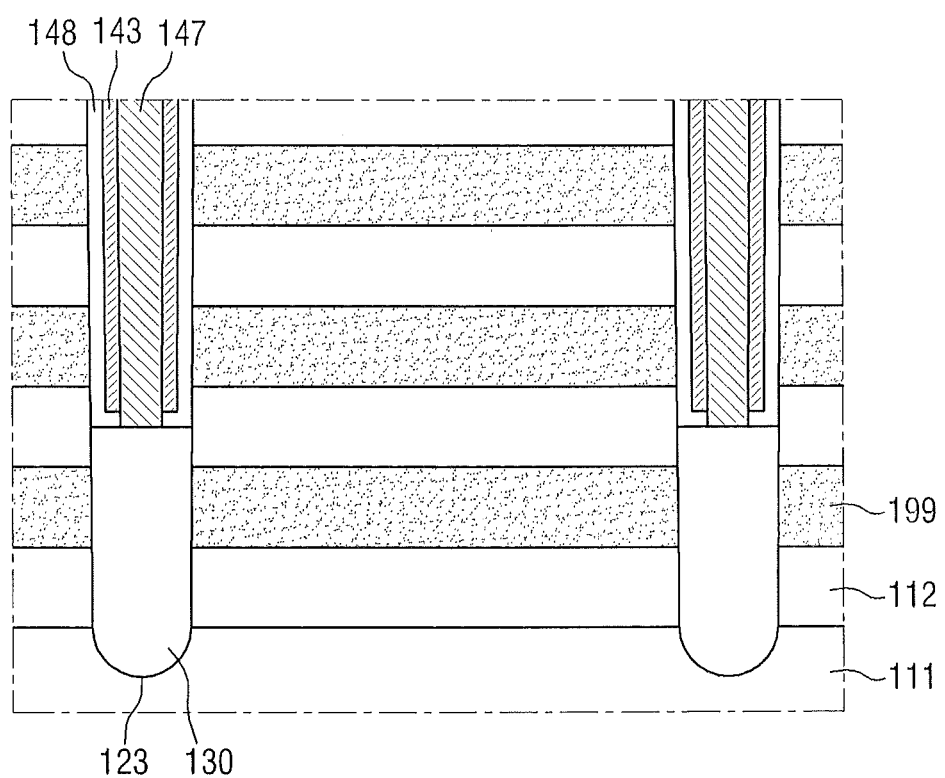

Referring to FIG. 19, the second electrode 147, which contacts the epitaxial layer 130, is formed within the second penetrating portion 146 (see FIG. 18). Here, the first electrode 143 may not contact the epitaxial layer 130, but the second electrode 147 may contact the epitaxial layer 130.

Figure 20:
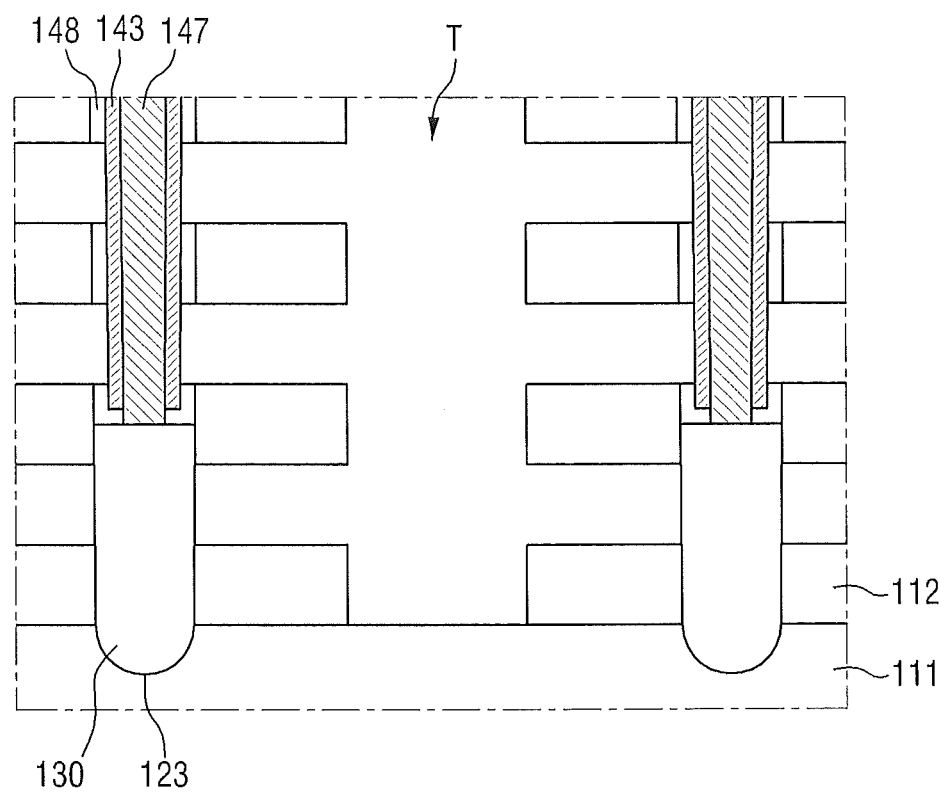

Referring to FIG. 20, the first sacrificial films 199 (see FIG. 19) and the oxide film 148 are removed to expose regions of side surfaces of the epitaxial layer 130 and regions of side surfaces of the first electrode 143. Here, the first sacrificial films 199 (see FIG. 19) may be removed using, e.g., phosphoric acid until regions of side surfaces of the oxide film 148 are exposed, and the exposed regions of the side surfaces of the oxide film 148 may be removed using, e.g., HF until regions of the side surfaces of the first electrode 143 are exposed.

Figure 21:
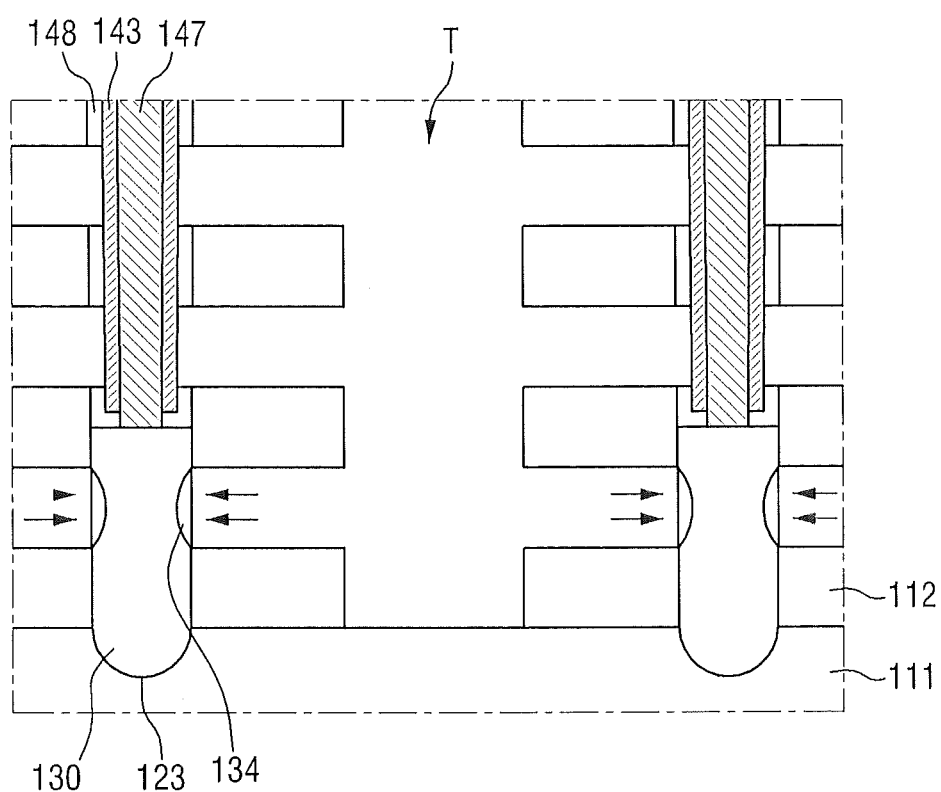
Figure 22:
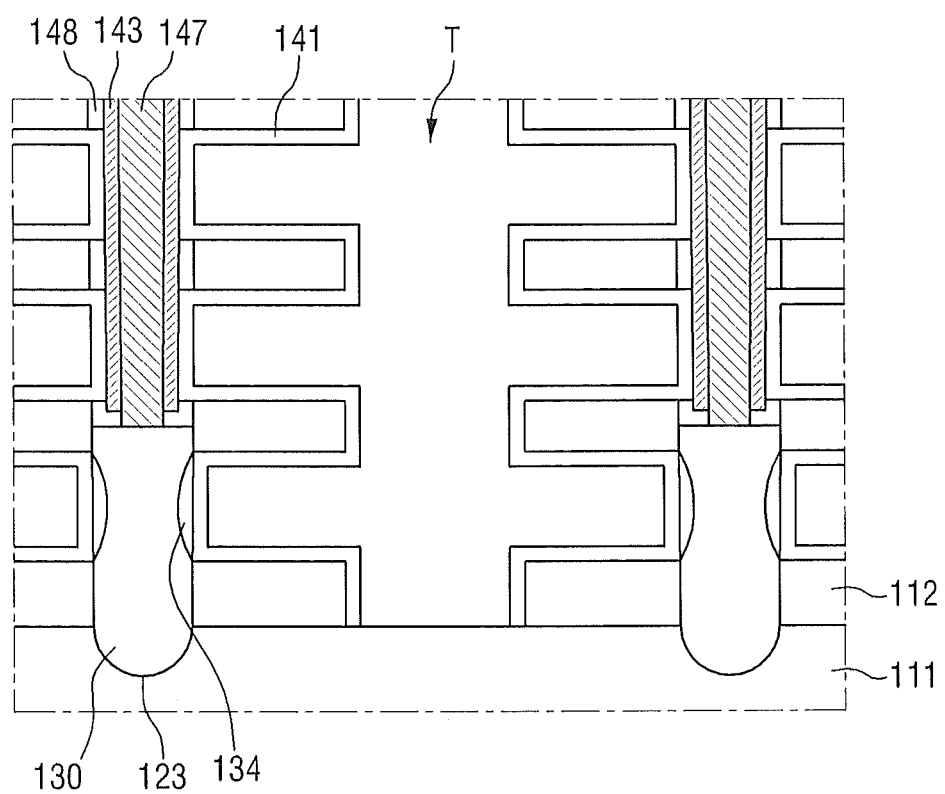

Referring to FIG. 21, an insulating film 134 is formed inside the exposed regions of the side surfaces of the epitaxial layer 130. Referring to FIG. 22, a resistance change film 141 is formed along a top surface of an interlayer insulating film 112 disposed thereunder, the side surfaces of the epitaxial layer 130 or the side surfaces of the first electrode 143, and a bottom surface of an interlayer insulating film 112 thereon. Here, the resistance change film 141 may be formed to contact the oxide film 148.

Referring to FIG. 16, each group of a plurality of third electrodes 211 through 291, 212 through 292, or 213 through 293 are formed on the resistance change film 141. Specifically, a conductive material is formed on the resistance change film 141 and fills an isolation trench T. Then, the isolation trench T is formed again, thereby forming each group of the third electrodes 211 through 291, 212 through 292 or 213 through 293 on the resistance change film 141. In the process of forming the isolation trench T again, the resistance change film 141 formed on the side surfaces of the interlayer insulating films 112 may be removed.

Hereinafter, a memory system according to some embodiments of the present invention and application examples thereof will be described with reference to FIGS. 23 through 25.

Figure 23:
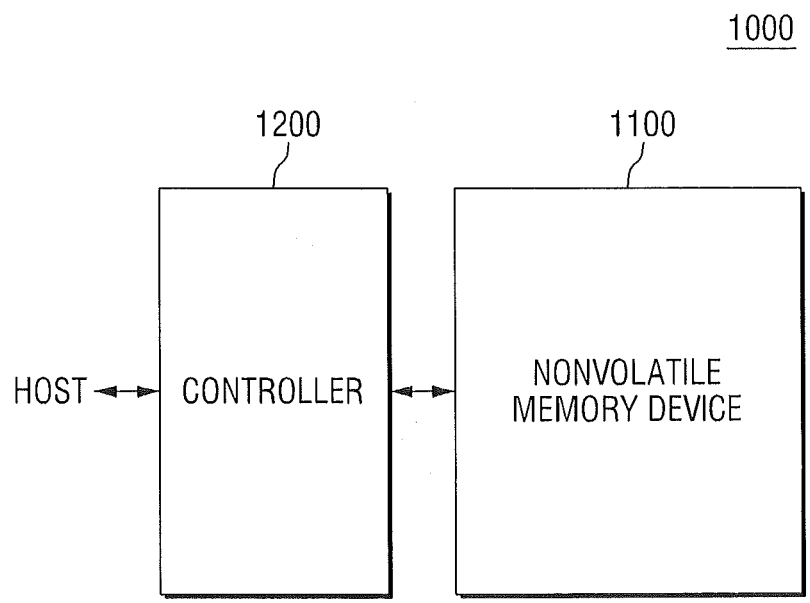
FIG. 23 is a block diagram of a memory system according to some embodiments of the present invention.

FIG. 23 is a block diagram of a memory system 1000 according to some embodiments of the present invention. FIG. 24 is a block diagram of an application example of the memory system 1000 shown in FIG. 23. FIG. 25 is a block diagram of a computing system 3000 including a memory system 2000 of FIG. 24.

Referring to FIG. 23, the memory system 1000 includes a nonvolatile memory device 1100 and a controller 1200.

The nonvolatile memory device 1100 may be a vertically stacked nonvolatile memory device including a transistor, which controls the above-described memory cells on a predetermined unit-by-unit basis (e.g., a page-by-page basis or a section-by-section basis).

The controller 1200 is connected to a host and the nonvolatile memory device 1100. The controller 1200 is configured to access the nonvolatile memory device 1100 in response to a request from the host. For example, the controller 1200 may be configured to control read/write/erase/background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 further includes well-known components, such as a random access memory (RAM), a processing unit, a host interface, and a memory interface. The RAM is used as at least one of a working memory of the processing unit, a cache memory between the nonvolatile memory deice 1100 and the host, and a buffer memory between the nonvolatile memory device 1100 and the host. The processing unit controls the overall operation of the controller 1200.

The host interface includes a protocol for data exchange between the host and the controller 1200. For example, the controller 1200 may be configured to communicate with an external device (e.g., the host) using at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface may interface with the nonvolatile memory device 1100. For example, the memory interface includes a NAND interface or a NOR interface.

The memory system 1000 may further include an error correction block. The error correction block may be configured to detect and correct an error in data read from the nonvolatile memory device 1100 by using an error correction code (ECC), For example, the error correction block may be provided as a component of the controller 1200. The error correction block can also be provided as a component of the nonvolatile memory device 1100, The controller 1200 and the nonvolatile memory device 1100 may be integrated into one semiconductor device. As an example, the controller 1200 and the nonvolatile memory device 1100 may be integrated into one semiconductor device to comprise a memory card. For example, the controller 1200 and the nonvolatile memory device 1100 may be integrated into one semiconductor device to comprise a personal computer (PC) card (e.g., Personal Computer Memory Card International Association (PCMCIA)), a compact flash card (CF), smart media card (SM/SMC), a memory stick, a multimedia card (e.g., MMC, RS-MMC and MMCmicro), a SD card (e.g., SD, miniSD, and microSD), or a universal flash storage (UFS).

As another example, the controller 1200 and the nonvolatile memory device 1100 may be integrated into one semiconductor device to comprise a solid state drive (SSD). The SSD includes a storage device, which stores data in a semiconductor memory. When the memory system 1000 is used as an SSD, the operation speed of the host connected to the memory system 1000 may increase significantly.

As another example, the memory system 1000 may be applicable to computers, ultra-mobile PCs (UMPCs), workstations, net-books, personal digital assistants (PDAs), portable computers, web tablets, wireless phones, mobile phones, smart phones, e-books, portable multimedia players (PMPs), portable game devices, navigation devices, black boxes, digital cameras, three-dimensional televisions, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

As another example, the nonvolatile memory device 1100 or the memory system 1100 may be mounted in various types of packages. Examples of packages that may include the nonvolatile memory device 1100 or the memory system 1000 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 24:
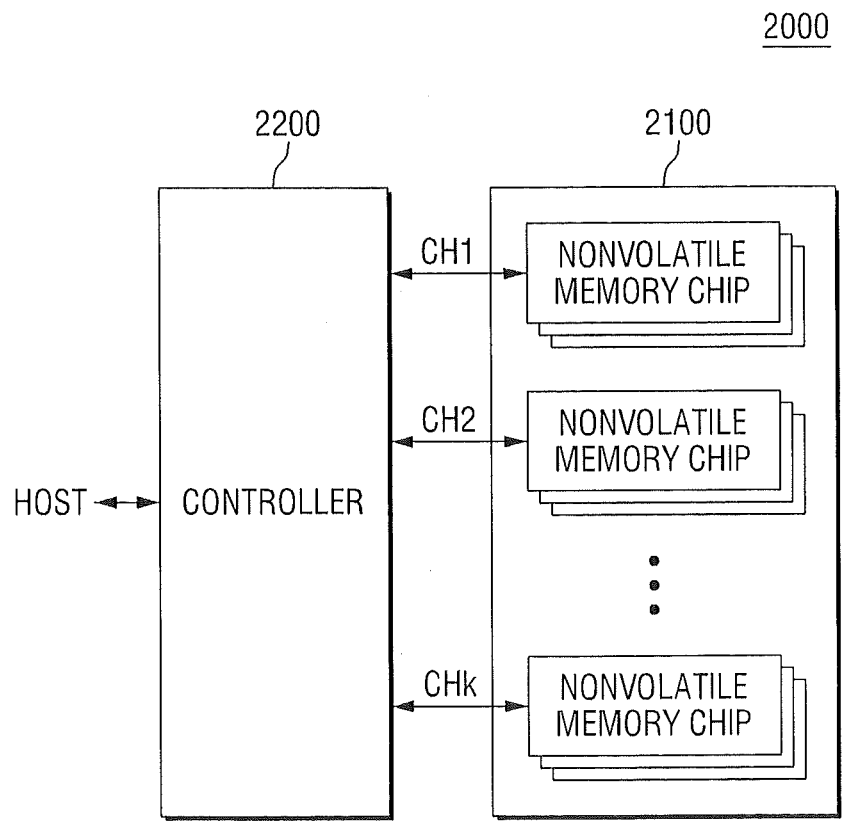
FIG. 24 is a block diagram of an application example of the memory system shown in FIG. 23.

Referring to FIG. 24, the memory device 2000 includes a nonvolatile memory device 2100 and a controller 2200. The nonvolatile memory device 2100 includes a plurality of nonvolatile memory chips. The nonvolatile memory chips form multiple memory chip groups. Each of the memory chip groups has a common channel for communication with the controller 2200. For example, it is illustrated in FIG. 24 that the nonvolatile memory chips communicate with the controller 2200 through first through $k^{th}$ channels CH1 through CHk.

In FIG. 24, a plurality of nonvolatile memory chips are connected to one channel. However, the memory system 2000 can be modified such that one nonvolatile memory chip is connected to one channel.

Figure 25:
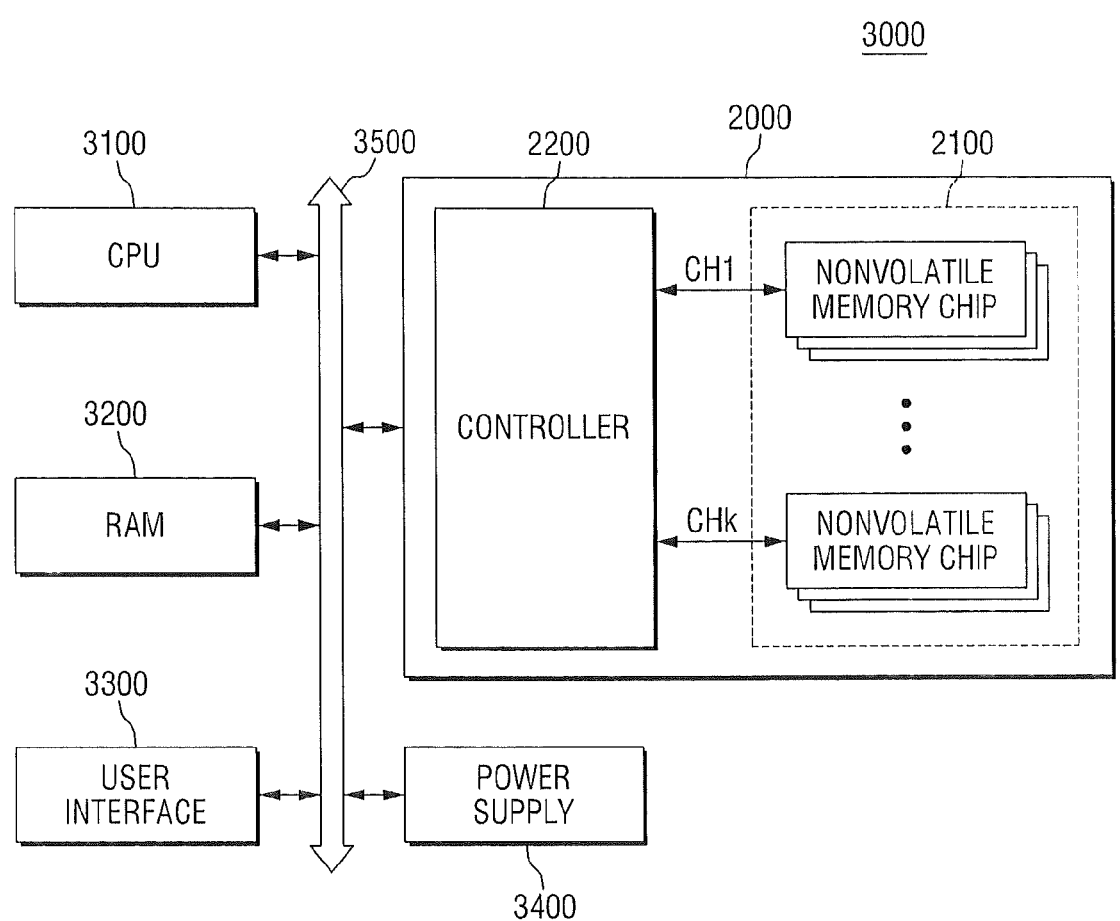
FIG. 25 is a block diagram of a computing system including a memory system of FIG. 24.

Referring to FIG. 25, the computing system 3000 includes a central processing unit (CPU) 3100, a RAM 3200, a user interface 3300, a power supply 3400, and a memory system 2000.

The memory system 2000 is electrically connected through a system bus 3500 to the CPU 3100, the RAM 3200, the user interface 3300, and the power supply 3400. Data, which are provided through the user interface 3300 or processed by the CPU 3100, are stored in the memory system 2000.

In FIG. 25, the nonvolatile memory device 2100 is connected to the system bus 3500 through the controller 2200. However, the nonvolatile memory device 2100 can also be connected directly to the system bus 3500.

In FIG. 25, the memory system 2000 described above with reference to FIG. 24 is provided. However, the memory system 2000 can be replaced by the memory system 1000 described above with reference to FIG. 23.

The computing system 3000 can also include all of the memory systems 1000 and 2000 described above with reference to FIGS. 23 and 24.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method of fabricating a nonvolatile memory device, the method comprising:
sequentially stacking a first interlayer insulating film, a first sacrificial film, a second interlayer insulating film, and a second sacrificial film on a semiconductor substrate;
forming a first penetrating portion, which exposes a region of a top surface of the semiconductor substrate, by etching the first and second interlayer insulating films and the first and second sacrificial films;
forming an epitaxial layer on the exposed region of the top surface of the semiconductor substrate in the first penetrating portion by epitaxial growth;
forming a first electrode, which contacts a resistance change film and the epitaxial layer, in the first penetrating portion;
exposing regions of side surfaces of the epitaxial layer by removing the first sacrificial film;
forming an insulating film inside the exposed regions of the side surfaces of the epitaxial layer; and
forming a second electrode on the exposed regions of the side surfaces of the epitaxial layer.

2. The method of claim 1, wherein a top surface of the epitaxial layer is higher than a top surface of the first sacrificial film.

3. The method of claim 2, wherein the top surface of the epitaxial layer is lower than a bottom surface of the second sacrificial film.

4. The method of claim 2, wherein the forming of the first penetrating portion comprises forming a first trench in the semiconductor substrate by over-etching the semiconductor substrate, wherein the epitaxial layer is formed in and on the first trench.

5. The method of claim 1, wherein the resistance change film is transition metal oxide (TMO).

6. The method of claim 1, wherein at least one of the first electrode and the second electrode is made of metal.

7. The method of claim 1, wherein the first electrode comprises a third electrode and a fourth electrode, and the forming of the first electrode, which contacts the resistance change film and the epitaxial layer, in the first penetrating portion comprises:
sequentially forming the resistance change film, the third electrode, and a third sacrificial film along the inside of walls of the first penetrating portion and the top surface of the epitaxial layer;
forming a second penetrating portion, which exposes a region of the top surface of the epitaxial layer, by etching the resistance change film, the third electrode, and the third sacrificial film; and
forming the fourth electrode, which contacts the epitaxial layer, in the second penetrating portion.

8. The method of claim 7, wherein the forming of the second penetrating portion comprises forming a second trench in the epitaxial layer by over-etching the epitaxial layer, wherein the fourth electrode is formed in and on the second trench.

9. The method of claim 1, wherein the insulating film comprise an oxide film.

10. The method of claim 9, wherein the oxide film is formed by heat oxidation of the exposed regions of the side surfaces of the epitaxial layer.

11. The method of claim 1, further comprising:
exposing regions of side surfaces of the resistance change film by removing the second sacrificial film; and
forming the second electrode on the exposed regions of the side surfaces of the resistance change film.

12. A method of fabricating a nonvolatile memory device, the method comprising:
sequentially stacking a first interlayer insulating film, a first sacrificial film, a second interlayer insulating film, and a second sacrificial film on a semiconductor substrate;
forming a first penetrating portion, which exposes a region of a top surface of the semiconductor substrate, by etching the first and second interlayer insulating films and the first and second sacrificial films;
forming an epitaxial layer on the exposed region of the top surface of the semiconductor substrate by epitaxial growth;
sequentially forming a first electrode and a third sacrificial film along the inside of walls of the first penetrating portion and a top surface of the epitaxial layer;
forming a second penetrating portion, which exposes a region of the top surface of the epitaxial layer, by etching the first electrode and the third sacrificial film;
forming a second electrode, which contacts the epitaxial layer, in the second penetrating portion;
exposing regions of side surfaces of the epitaxial layer by removing the first sacrificial film;
forming an insulating film inside the exposed regions of the side surfaces of the epitaxial layer;
forming a resistance change film along a top surface of the first interlayer insulating film, the exposed regions of the side surfaces of the epitaxial layer, and a bottom surface of the second interlayer insulating film; and
forming a third electrode on the resistance change film.

13. The method of claim 12, further comprising:
exposing regions of side surfaces of the first electrode by removing the second sacrificial film; and
forming the resistance change film along a top surface of the second interlayer insulating film and the exposed regions of the side surfaces of the first electrode.

14. The method of claim 13, further comprising forming an oxide film along the inside of the walls of the first penetrating portion and the top surface of the epitaxial layer, wherein the forming of the second penetrating portion further comprises etching the oxide film, and the removing of the second sacrificial film further comprises exposing the regions of the side surfaces of the first electrode by removing the oxide film.

15. The method of claim 12, wherein the forming of the third electrode comprises:
forming a conductive material on the resistance change film; and
forming the third electrode, which exposes side surfaces of the first and second interlayer insulating films, by etching part of the resistance change film and part of the conductive material.

16. A method of forming a non-volatile memory device, comprising:
providing a substrate;
forming a sacrificial film on the substrate;
forming a penetrating portion that exposes a top surface of the substrate by etching the sacrificial film;

forming an epitaxial layer in the penetrating portion on the top surface of the substrate;

removing the sacrificial film to expose regions of side surfaces of the epitaxial layer;

forming an insulating film in the side surfaces of the epitaxial layer that have been exposed;

forming a transistor on the substrate, the transistor comprising a gate electrode disposed on the insulating film;

forming a plurality of vertically stacked RRAM cells on the transistor; and forming a common electrode that is shared by the plurality of vertically stacked RRAM cells, the common electrode coupling a ground voltage from the substrate to the plurality of vertically stacked RRAM cells;

forming resistance variable layers on side surfaces of the common electrode;

wherein the transistor is operable to transfer the ground voltage from the substrate to the plurality of vertically stacked RRAM cells responsive to the gate electrode being driven to a voltage level higher than a threshold voltage level such that a channel is formed in the epitaxial layer; and wherein the common electrode is disposed in the penetrating portion above the epitaxial layer relative to the substrate and between ones of the plurality of vertically stacked RRAM cells.

17. The method of claim 16, wherein the resistance variable layers comprise a transition metal oxide.

18. The method of claim 16, wherein forming the insulating film comprises forming an oxide film by heat oxidation.

* * * * *